United States Patent [19]

Mori et al.

[11] Patent Number: 5,370,760

[45] Date of Patent: Dec. 6, 1994

[54] METHOD OF MANUFACTURING MULTILAYER CERAMIC ELECTRONIC COMPONENT

[75] Inventors: Haruhiko Mori; Ikuko Hiramatsu; Koichi Saito, all of Kyoto, Japan

[73] Assignee: Murata Manufacturing Co., Ltd., Kyoto, Japan

[21] Appl. No.: 127,329

[22] Filed: Sep. 27, 1993

[30] Foreign Application Priority Data

Sep. 29, 1992 [JP] Japan .................. 4-258755

[51] Int. Cl.[5] .......................................... C03B 29/00
[52] U.S. Cl. .................................... 156/89; 425/518;
425/519; 425/520; 425/521; 425/330; 425/345;
425/389; 425/390; 425/394; 425/405.2;
425/225; 425/338; 156/245; 264/500; 264/510;
264/511; 264/37; 264/60; 264/297.4; 264/62
[58] Field of Search ............... 425/77, 507, 508, 518,
425/519, 520, 521, 330, 342, 343, 345, 346, 349,
387.1, 389, 390, 394, 395, 398, 399, 403, 405.1,
405.2, 406, 407, 408, 415, 225, 338, 344; 156/89,
245; 264/500, 510, 511, 37, 60, 62, 297.4, DIG. 57

[56] References Cited

U.S. PATENT DOCUMENTS

| | | | |
|---|---|---|---|
| 2,133,675 | 10/1938 | Ten Bosch | 425/330 |
| 2,417,226 | 3/1947 | Weyant | 425/390 |
| 3,060,506 | 10/1962 | Uschmann | 425/344 |
| 3,196,485 | 7/1965 | Baltonfield et al. | 425/415 |
| 3,647,332 | 3/1972 | Schmaus | 485/344 |
| 3,664,284 | 5/1972 | Sibley | 425/344 |
| 4,137,628 | 2/1979 | Suzuki | 29/625 |
| 4,249,977 | 2/1981 | Bartholomew | 156/288 |
| 4,347,650 | 9/1982 | Malarney | 29/25.42 |
| 4,399,089 | 8/1983 | Mohri et al. | 264/60 |
| 4,576,776 | 3/1986 | Anderson | 264/510 |
| 4,620,890 | 11/1986 | Myers et al. | 264/500 |
| 4,816,106 | 3/1989 | Turris et al. | 264/510 |
| 4,879,156 | 11/1989 | Herron et al. | 428/137 |
| 4,908,087 | 3/1990 | Murooka et al. | 156/286 |
| 4,920,640 | 5/1990 | Enloe et al. | 29/852 |
| 5,028,473 | 7/1991 | Vitriol et al. | 428/137 |
| 5,057,273 | 10/1991 | Hamson | 264/500 |
| 5,114,654 | 5/1992 | Hosoi | 264/313 |
| 5,130,067 | 7/1992 | Flaitz et al. | 264/60 |
| 5,137,663 | 8/1992 | Conaway | 425/78 |
| 5,174,842 | 12/1992 | Hanuro et al. | 156/89 |
| 5,178,208 | 1/1993 | Hawa et al. | 156/242 |
| 5,182,121 | 1/1993 | Miyashita | 425/338 |
| 5,194,196 | 3/1993 | Chance et al. | 264/60 |

FOREIGN PATENT DOCUMENTS 5-175072 7/1993 Japan .

OTHER PUBLICATIONS

U.K. Search Report, Jan. 6, 1994.

*Primary Examiner*—Karen M. Hastings
*Assistant Examiner*—Mark De Simone
*Attorney, Agent, or Firm*—Ostrolenk, Faber, Gerb & Soffen

[57] ABSTRACT

A ceramic laminate, which is obtained by stacking ceramic green sheets provided with conductor films distributed on central portions along surface directions thereof, is charged in a die assembly. The die assembly includes an upper punch for pressing a first major surface of the ceramic laminate, a frame which encloses peripheries of the upper punch and the ceramic laminate, and a base plate for pressing a second major surface of the ceramic laminate in a manner opposite to the upper punch. In order to prevent the conductor films from undergoing misregistration toward peripheral edge portions of the ceramic laminate due to flowing of ceramic caused by a pressure difference between the portions provided with the conductor films and those not provided with conductor films, the upper punch is divided into an outer peripheral portion which comes into contact with the peripheral edge portions of the ceramic laminate and a body portion which comes into contact with its central portion. In a step of exerting pressure, the outer peripheral portion compresses the laminate to a higher degree than the body portion, so that a substantially homogeneous pressure is applied to the overall laminate.

11 Claims, 7 Drawing Sheets

METHOD OF MANUFACTURING MULTILAYER CERAMIC ELECTRONIC COMPONENT

BACKGROUND OF THE INVENTION

1. Field of the Invention

The present invention relates to a method of manufacturing a multilayer ceramic electronic component, and more particularly, it relates to an improvement in a step of exerting pressure for increasing density of a ceramic laminate which is obtained by stacking a plurality of ceramic green sheets.

2. Description of the Background Art

A multilayer ceramic capacitor, which is an example of a multilayer ceramic electronic component, is manufactured in the following manner.

First, ceramic green sheets are prepared from a slurry containing dielectric powder, a binder and a solvent. Then, conductor films for defining internal electrodes are printed on predetermined ones of the ceramic green sheets, and a predetermined number of such ceramic green sheets are stacked to provide a ceramic laminate. Then, a pressure of several 100 kg/cm$^2$ to several t/cm$^2$ is exerted on the ceramic laminate at a temperature of 40° to 90° C., to increase density of the ceramic laminate. Thereafter the ceramic laminate is cut into predetermined dimensions, to obtain chips for independent multilayer ceramic capacitors. These chips are thereafter fired. Then, external electrodes are formed on both end portions of each chip, to obtain a desired multilayer ceramic capacitor.

The step of exerting pressure on a ceramic laminate which is included in the aforementioned method of manufacturing a multilayer ceramic capacitor is carried out in a step shown in FIG. 10, for example. A ceramic laminate 1 to be supplied with pressure is charged in a die assembly 2, and pressed through this die assembly 2. A rigid press or a hydrostatic press is employed for exerting such pressure. The die assembly 2 comprises an upper punch 3 which comes into contact with one major surface of the ceramic laminate 1, and a base 6 including a frame 4 which encloses the peripheries of the upper punch 3 and the ceramic laminate 1 and a base plate 5 which comes into contact with another major surface of the ceramic laminate 1 in a manner opposite to the upper punch 3. The ceramic laminate 1 is provided in its interior with conductor films 7 for defining internal electrodes. The conductor films 7 are formed to be distributed on central portions along surface directions of a plurality of specific ceramic green sheets forming the ceramic laminate 1, and overlapped with each other along the thickness direction of the ceramic laminate 1.

In the aforementioned step of exerting pressure on the ceramic laminate 1 through the die assembly 2, several disadvantages may result because a clearance is defined between the peripheral edge portion of the ceramic laminate 1 and the die assembly 2 and a portion of the ceramic laminate 1 provided with the conductor films 7 has a different thickness from those provided with no such films.

The ceramic contained in the ceramic laminate 1 which is compressed through the die assembly 2 along its thickness direction flows on the basis of its fluidity. Namely, the portion of the ceramic laminate 1 which is increased in thickness due to the provision of the conductor films 7 is so increased in pressure that the ceramic contained in this portion flows toward other portions that are not provided with conductor films 7 having relatively low pressures. However, although such flow is suppressed by friction in portions which are in contact with the upper punch 3 and the base plate 5 of the die assembly 2 respectively, the central portion along the thickness direction is free from such suppression and the ceramic contained therein flows easily and is moved a relatively large amount. Thus, those of the conductor films 7 which are located around the central portion of the ceramic laminate 1 along the thickness direction are extremely misregistered, as shown in FIG. 11. Referring to FIG. 11, symbol d denotes positional difference between the conductor films 7 resulting from such misregistration. This misregistration particularly remarkably appears in the conductive films 7 which are closer to end portions of the ceramic laminate 1.

Due to the aforementioned fluidity of the ceramic, further, the ceramic laminate 1 may be deformed along the major surface direction to degrees which are varied with the positions, in addition to the disadvantage shown in FIG. 11.

On the other hand, developments have been made in recent years to attain miniaturization and increase in capacitance of multilayer ceramic capacitors. In one of the countermeasures for such developments, an attempt has been made to reduce gaps d defined by internal electrodes 9 which are located in the interior of a multilayer chip 8, as shown in FIG. 12. However, if the conductor films 7 are misregistered as shown in FIG. 11, for example, the internal electrodes 9 provided by such conductor films 7 may be disadvantageously exposed on an undesired surface of the laminate chip 8 obtained by cutting the ceramic laminate 1, as shown in FIG. 13. This tendency remarkably appears as the gaps g shown in FIG. 12 are reduced. The internal electrodes 9 which are exposed on an undesired surface of the laminate chip 8 electrically conduct with both of external electrodes 10 and 1.1, to cause a failure of defective shorting.

When the conductor films 7 are misregistered, further, degrees of extension of the ceramic and the conductor films 7 caused by compression of the ceramic laminate 1 may be varied with the positions of the ceramic laminate 1, as hereinabove described. In this case, therefore, capacitance values are dispersed between a plurality of multilayer ceramic capacitors as obtained.

SUMMARY OF THE INVENTION

Accordingly, an object of the present invention is to provide a method of manufacturing a multilayer ceramic electronic component, which can avoid the aforementioned disadvantages.

The present invention is directed to a method of manufacturing a multilayer ceramic electronic component including a step of obtaining a ceramic laminate by stacking a plurality of ceramic green sheets including those provided with conductor films to be distributed on central portions along surface directions thereof, a step of preparing a die assembly including an upper punch for pressing a first major surface of the ceramic laminate, and a base including a frame which encloses the peripheries of the upper punch and the ceramic laminate and a base plate for pressing a second major surface of the ceramic laminate in a manner opposite to the upper punch, a step of charging the ceramic laminate in the die assembly, and a step of exerting pressure on the ceramic laminate through the die assembly, and in order to solve the aforementioned technical problems, the present invention includes the features described in the following paragraphs.

The upper punch is divided into an outer peripheral portion which comes into contact with peripheral edge portions of the first major surface of the ceramic laminate and a body portion which comes into contact with a central portion of the first major surface, so that these portions separately press the ceramic laminate. In the step of exerting pressure, the outer peripheral portion and the body portion of the upper punch are separately driven so that the outer peripheral portion compresses the ceramic laminate to a higher degree than the body portion.

According to the present invention, the difference in thickness between the central portion of the ceramic laminate which is increased in thickness by formation of the conductor films and the peripheral edge portions which are not provided with conductor films is absorbed due to the separate pressing operations of the body portion and the outer peripheral portion of the upper punch. Consequently, it is possible to exert a substantially homogeneous pressure on the overall area of the ceramic laminate having partially different thicknesses. Thus, it is possible to prevent the conductor films from experiencing misregistration, which is caused by the ceramic flowing from the portion provided with the conductor films and having a higher pressure toward the portions having relatively low pressures.

According to the present invention, therefore, it is possible to maintain the conductor films formed in the ceramic laminate in proper positions and dimensions also after a pressure is exerted on the ceramic laminate.

When the ceramic laminate is cut into a plurality of chips, therefore, it is possible to prevent exposition of the conductor films on undesired surfaces of the chips and dispersion of electrical characteristics between the chips. In cutting the ceramic laminate, further, it is not necessary to consider misregistration of the conductor films, whereby the chips can be formed with exact and uniform dimensions.

When the present invention is applied to a multilayer ceramic capacitor, it is possible to attain miniaturization and an increase in capacitance since the gaps g shown in FIG. 12 can be easily reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 1 to 4 show some steps which are included in a method of manufacturing a multilayer ceramic electronic component according to an embodiment of the present invention.

Figure 1:
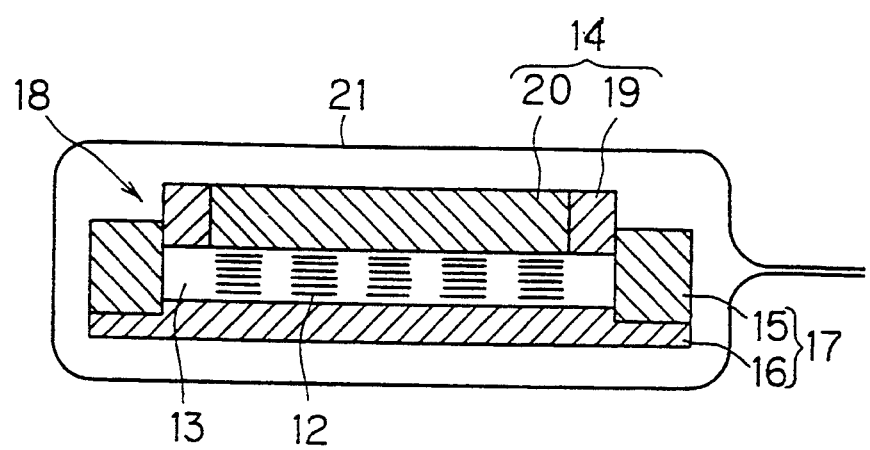
FIG. 1 is a sectional view showing a first step included in a method of manufacturing a multilayer ceramic electronic component according to an embodiment of the present invention.

Referring to FIG. 1, a ceramic laminate 13 is first prepared by stacking a plurality of ceramic green sheets including those provided with conductor films 12 which are formed to be distributed on central portions along surface directions thereof.

On the other hand, also prepared is a die assembly 18 including an upper punch 14 which comes into contact with a first major surface of the ceramic laminate 13, and a base 17 including a frame 15 which encloses the peripheries of the upper punch 14 and the ceramic laminate 13 and a base plate 16 which comes into contact with a second major surface of the ceramic laminate 13 in a manner opposite to the upper punch 14. While the frame 15 and the base 16 forming the base 17 are separable from each other in the die assembly 18 according to this embodiment, the frame 15 and the base plate 16 may be mechanically integrated with each other.

The feature of this embodiment resides in the structure of the upper punch 14. This upper punch 14 is divided into an outer peripheral portion 19 which comes into contact with peripheral edge portions of the first major surface of the ceramic laminate 13 and a body portion 20 which comes into contact with a central portion of the first major surface, so that these portions separately press the ceramic laminate 13.

The aforementioned die assembly 18 is charged with the ceramic laminate 13. Then, pressure is exerted on the ceramic laminate 13 through the die assembly 18. According to this embodiment, a hydrostatic press is applied to exert such pressure. Therefore, the die assembly 18 which is charged with the ceramic laminate 13 is first introduced into a bag 21, and vacuum-packed with this bag 21.

Figure 2:
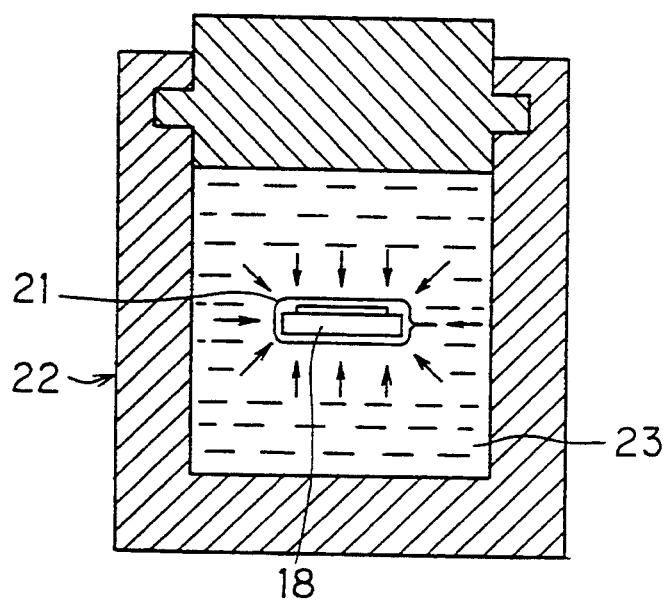
FIG. 2 is a sectional view showing a second step included in the embodiment shown in FIG. 1.

Then, the die assembly 18 which is vacuum-packed with the bag 21 is arranged in a hydrostatic press unit 22, as shown in FIG. 2. The hydrostatic press unit 22 pressurizes water 23, thereby isotropically pressing the ceramic laminate 13 (FIG. 1) through the die assembly 18. The water 23 is heated to about 70° C., for example, in order to improve fluidity of a binder contained in the ceramic thereby increasing bond strength between the ceramic green sheets.

Figure 3:
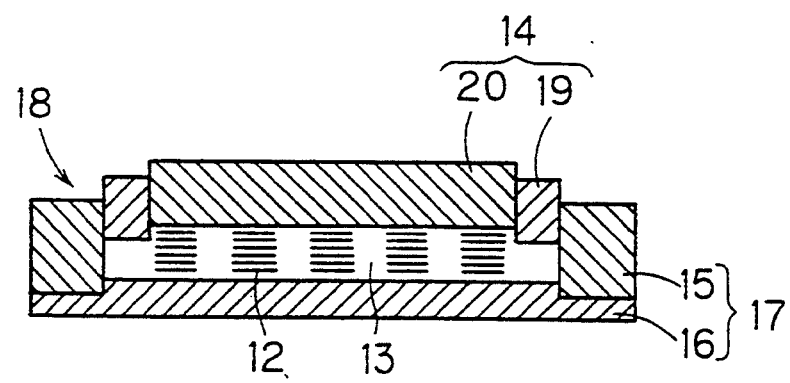
FIG. 3 is a sectional view showing a third step included in the embodiment shown in FIG. 1.
Figure 10:
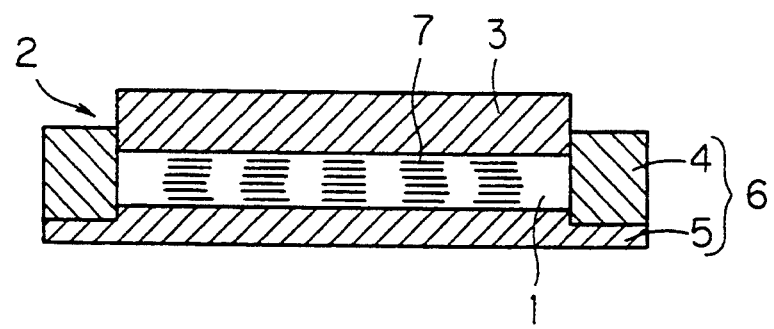
FIG. 10 is a sectional view showing a die assembly 2 which is charged with a ceramic laminate 1, for illustrating a conventional method of manufacturing a multilayer ceramic electronic component.
Figure 11:
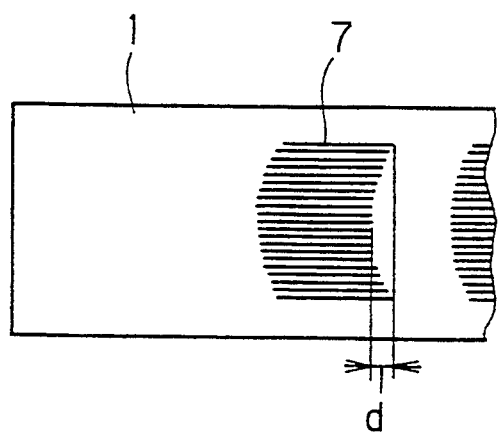
FIG. 11 is a partially enlarged sectional view of the ceramic laminate 1, for illustrating a problem caused in the method shown in FIG. 10.
Figure 12:
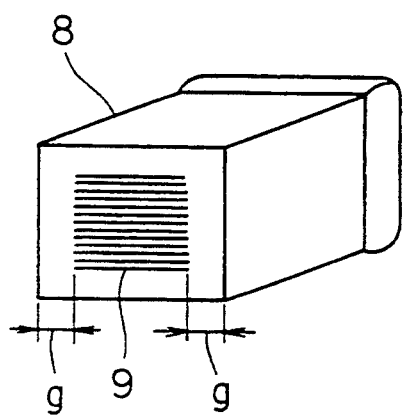
FIG. 12 is a perspective view showing a laminate chip 8 for a multilayer ceramic capacitor.
Figure 13:
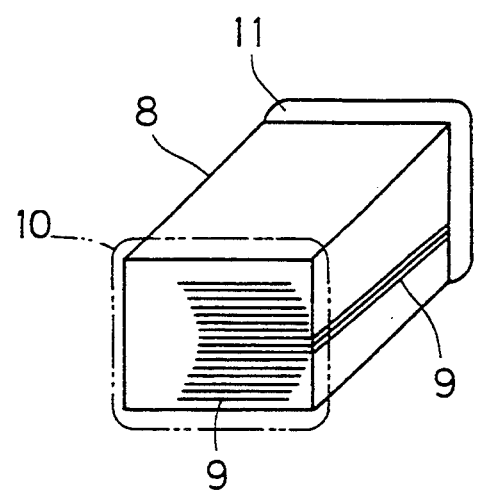
FIG. 13 is a perspective view showing the laminate chip 8 for illustrating a disadvantage caused by the problem shown in FIG. 11

In the aforementioned pressure exerting step, the outer peripheral portion 19 of the upper punch 14 compresses the ceramic laminate 13 to a higher degree than the body portion 20, as shown in FIG. 3. This may be achieved since the outer peripheral portion 19 of the upper punch 14 is pressed in advance of the body portion 20. Therefore, it is possible to prevent undesired misregistration of the conductor films 12 caused by the ceramic which flows from the portion provided with the conductor films 12 toward those provided with no conductive films due to pressure difference caused in the interior of the ceramic laminate 13 by the conductor films 12, unlike the conventional method employing the die assembly 2 shown in FIG. 10.

Figure 4:
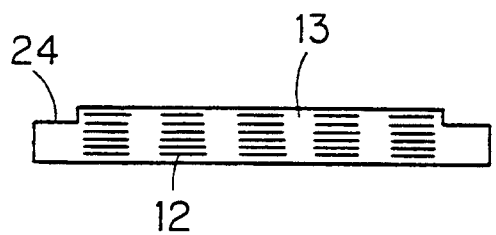
FIG. 4 is a sectional view showing a fourth step included in the embodiment shown in FIG. 1.

After the aforementioned pressure exerting step is completed, the ceramic laminate 13 is taken out from the die assembly 18, as shown in FIG. 4. This ceramic laminate 13 is provided with steps 24 on its peripheral edge portions, due to the separate pressing operations by the outer peripheral portion 19 and the body portion 20 of the upper punch 14. The portions provided with such steps 24 do not define regions for taking out chips for providing independent multilayer ceramic electronic components upon cutting of the ceramic laminate 13, whereby no problem is caused by formation of such steps 24.

Figure 5:
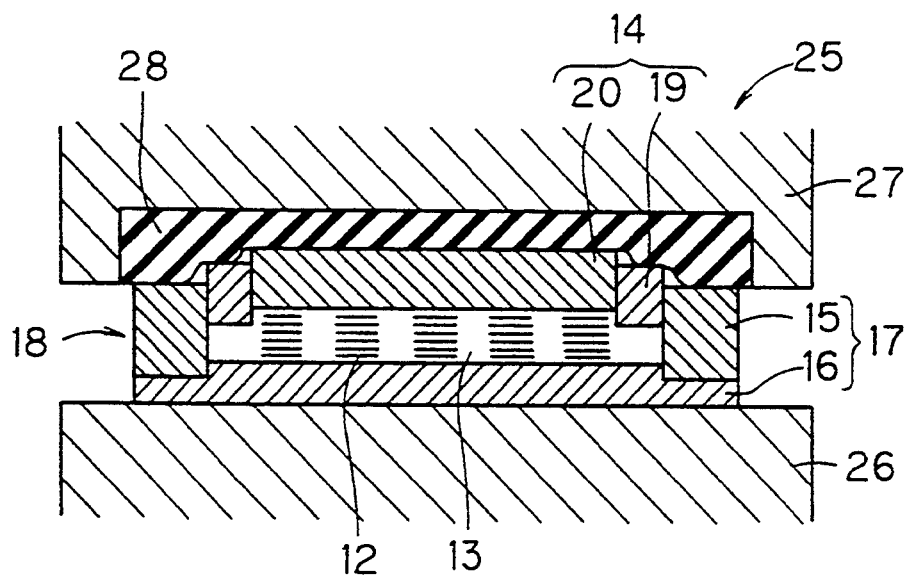
FIG. 5 is a sectional view showing a pressure exerting step included in a method of manufacturing a multilayer ceramic electronic component according to another embodiment of the present invention.

FIG. 5 shows a pressure exerting step which is included in a method of manufacturing a multilayer ceramic electronic component according to another embodiment of the present invention. According to this embodiment, the aforementioned hydrostatic press is replaced by a rigid press.

Referring to FIG. 5, a rigid press unit 25 includes a bed 26 and a ram 27. The aforementioned die assembly 18 which is charged with a ceramic laminate 13 is arranged between the bed 26 and the ram 27. Further, a flexible member 28 which is made of rubber, for example, is inserted between an upper punch 14 and the ram 27. This flexible member 28 enables separate pressing operations of an outer peripheral portion 19 and a body portion 20 of the upper punch 14, similar to the case of hydrostatic pressing employed in the first embodiment. Referring to FIG. 5, elements corresponding to those shown in FIGS. 1 to 4 are denoted by similar reference numerals, to omit redundant description.

In the embodiment shown in FIG. 5, the flexible member 28 may be omitted and the rigid press unit may alternatively have a structure capable of pressurizing the outer peripheral portion 19 and the body portion 20 of the upper punch 14 independently of each other. In this case, the outer peripheral portion 19 of the upper punch 14 is preferably pressurized in advance of the body portion 20.

Figure 6:
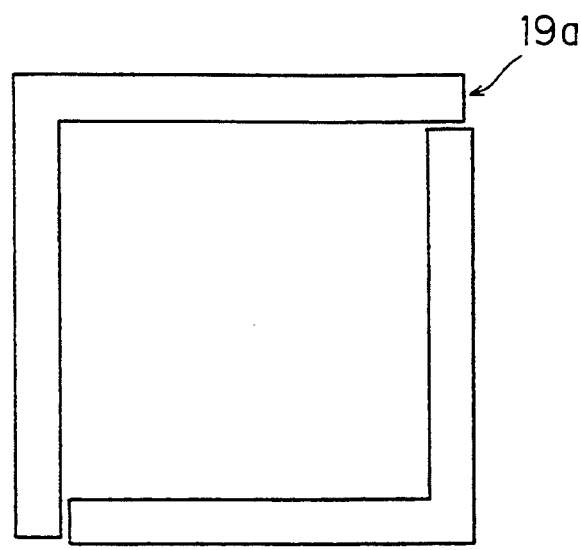
FIG. 6 is a plan view showing an outer peripheral portion 19a, which is a modification of an outer peripheral portion 19 of an upper punch 14 shown in FIG. 1.
Figure 7:
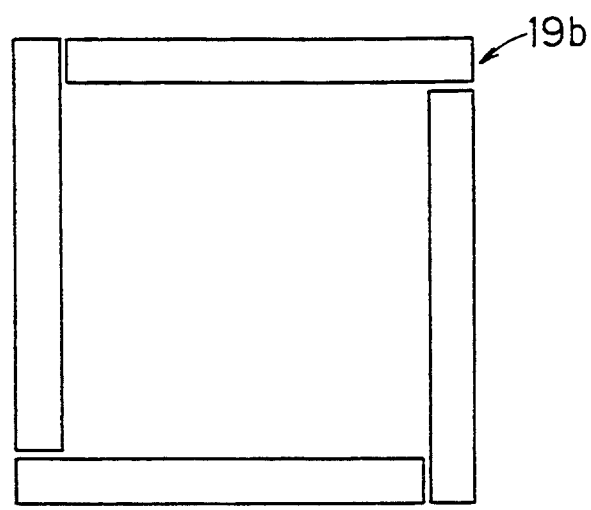
FIG. 7 is a plan view showing an outer peripheral portion 19b, which is another modification of the outer peripheral portion 19 shown in FIG. 1.
Figure 8:
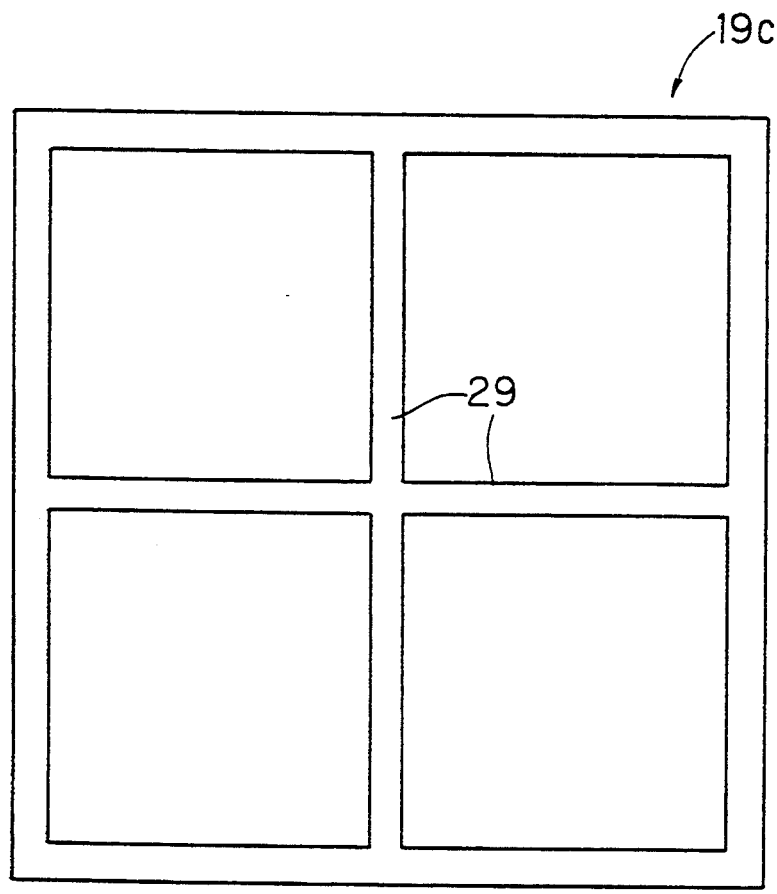
FIG. 8 is a plan view showing an outer peripheral portion 19c, which is still another modification of the outer peripheral portion 19 shown in FIG. 1.

FIGS. 6 to 8 show modifications of the outer peripheral portion 19 of the upper punch 14 employed in each of the aforementioned embodiments respectively.

While the outer peripheral portion 19 is provided by an integral square-shaped frame member in each of the aforementioned embodiments, the same may be replaced by an outer peripheral portion 19a which is divided into two portions as shown in FIG. 6, or an outer peripheral portion 19b which is divided into four portions as shown in FIG. 7. When a ceramic laminate to be pressurized has large dimensions, an outer peripheral portion 19c including a lattice 29 may be employed as shown in FIG. 8. When such an outer peripheral portion 19c is employed, the body portion 20 is also divided into four portions, for example.

Figure 9:
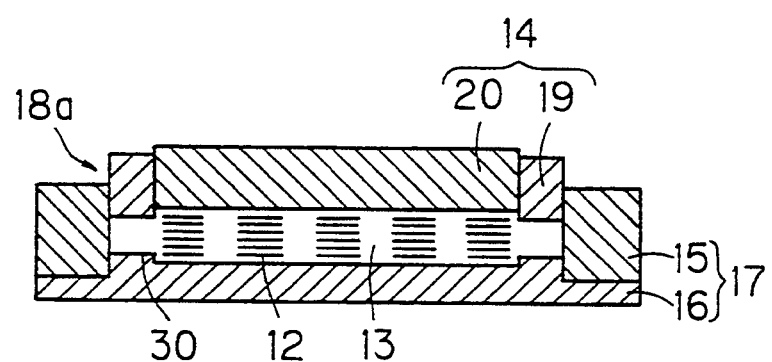
FIG. 9 is a sectional view, corresponding to FIG. 3, for illustrating still another embodiment of the present invention.

FIG. 9 is a sectional view corresponding to FIG. 3, for illustrating still another embodiment of the present invention.

A die assembly 18a employed in this embodiment is characterized in that a protrusion 30 is provided on a base plate 16 in a position corresponding to an outer peripheral portion 19. Structures of other portions provided in this embodiment are substantially similar to those of the die assembly 18 shown in FIG. 3, and hence corresponding elements are denoted by similar reference numerals, to omit redundant description. When the die assembly 18a shown in FIG. 9 is employed, steps corresponding to the steps 24 (FIG. 4) are formed on both surfaces of peripheral edge portions of a ceramic laminate 13 when the same is pressurized.

The present invention is not restricted to a method of manufacturing the aforementioned multilayer ceramic capacitor, but can be widely applied to multilayer ceramic electronic components such as a multilayer ceramic inductor, a ceramic multilayer circuit board and the like.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a multilayer ceramic electronic component, comprising the steps of:

obtaining a ceramic laminate by stacking a plurality of ceramic green sheets, at least one of said ceramic green sheets having conductor films located thereon;

preparing a die assembly comprising an upper punch for pressing a first major surface of said ceramic laminate, and a base including a frame for enclosing peripheries of said upper punch and said ceramic laminate and a base plate for pressing a second major surface of said ceramic laminate in a manner opposite to said upper punch, said step of preparing said die assembly including a step of preparing said upper punch to have an outer peripheral portion to be in contact with peripheral edge portions of said first major surface of said ceramic laminate and a body portion to be in contact with a central portion of said first major surface so that said outer peripheral portion and said body portion separately press said ceramic laminate;

charging said ceramic laminate in said die assembly; and exerting pressure on said ceramic laminate through said die assembly, the step of exerting pressure including a step of separately driving said outer peripheral portion and said body portion of said upper punch so that said outer peripheral portion compresses said ceramic laminate to a higher degree than said body portion.

2. A method of manufacturing a multilayer ceramic electronic component in accordance with claim 1, wherein said step of exerting pressure comprises a step of applying a hydrostatic pressure onto said ceramic laminate through said die assembly.

3. A method of manufacturing a multilayer ceramic electronic component in accordance with claim 2, wherein water employed in said hydrostatic pressure applying step is heated.

4. A method of manufacturing a multilayer ceramic electronic component in accordance with claim 1, wherein said step of exerting pressure comprises a step of applying a rigid press to said ceramic laminate through said die assembly.

5. A method of manufacturing a multilayer ceramic electronic component in accordance with claim 4, wherein said rigid press is applied to said upper punch through a flexible member in said rigid pressing step.

6. A method of manufacturing a multilayer ceramic electronic component in accordance with claim 1, wherein said outer peripheral portion is formed by an integral frame member.

7. A method of manufacturing a multilayer ceramic electronic component in accordance with claim 1, wherein said outer peripheral portion has a dividable structure.

8. A method of manufacturing a multilayer ceramic electronic component in accordance with claim 1, wherein said outer peripheral portion forms a lattice, said body portion being divided in response to said lattice.

9. A method of manufacturing a multilayer ceramic electronic component in accordance with claim 1, wherein said base plate is provided with a protrusion at a position corresponding to that of said outer peripheral portion.

10. A method of manufacturing a multilayer ceramic electronic component in accordance with claim 1, wherein said multilayer ceramic electronic component is a multilayer ceramic capacitor.

11. A method of manufacturing a multilayer ceramic electronic component in accordance with claim 1, wherein said outer peripheral portion starts to exert pressure in advance of said body portion exerting pressure in said step of exerting pressure.

* * * * *